July 31, 1962 M. D. HESLOP 3,047,806

RANDOM PULSE DISCRIMINATOR CIRCUIT

Filed Oct. 22, 1959 2 Sheets-Sheet 1

*INVENTOR.*

MOYLEN D. HESLOP

*BY* John F. Lawler

ATTORNEY

July 31, 1962 M. D. HESLOP 3,047,806

RANDOM PULSE DISCRIMINATOR CIRCUIT

Filed Oct. 22, 1959 2 Sheets-Sheet 2

*INVENTOR.*
MOYLEN D. HESLOP

BY John F. Lawler

ATTORNEY

United States Patent Office 3,047,806

Patented July 31, 1962

3,047,806
RANDOM PULSE DISCRIMINATOR CIRCUIT

Moylen D. Heslop, Mountain View, Calif., assignor to Sylvania Electric Products, Inc., a corporation of Delaware Filed Oct. 22, 1959, Ser. No. 847,945
2 Claims. (Cl. 328—37)

This invention relates to receiver circuits for improving signal to noise ratio, and more particularly to an improved noise gate for eliminating random noise pulses.

In order to maximize the sensitivity of a pulse receiver, it is desirable to work as close to receiver noise level as possible. In many applications, much of the noise can be eliminated by a noise riding threshold circuit which develops a clipping level from the noise present, slices the desired signal above the noise, and regenerates and amplifies these signals. There are, however, random noise pulses which will exceed the clipping level of any threshold circuit unless this threshold level is set to a high value. This results in a corresponding de-sensitizing of the receiver since desired signals below this level are eliminated.

In accordance with the present invention, the sensitivity of the receiver can be improved by reducing the threshold level of such a clipping circuit as closely as possible to the steady noise level, and utilizing a noise gate which eliminates random noise pulses having amplitudes in excess of this clipping level. The receiver is thus permitted to operate immediately above the steady noise level with corresponding increase in the sensitivity of the circuit.

The noise gate, according to my invention, eliminates random noise pulses on the basis of time spacing between them. The gate qualifies only those pulse signals which appear in a group of consecutive sign, for example, four, with a certain minimum and uniform time spacing. The circuitry utilizes a shift register in conjunction with a variable frequency clock source, and is arranged such that at least four successive input pulses having a certain minimum pulse repetition frequency must be fed to the input of the register before that signal is accepted or "qualified" as a legitimate signal. The shift register retains a history of the pulses that exceed the threshold level during the interval of three clock periods so that the fourth occurrence of the desired pulse within the clock period is passed to the output, thereby indicating the presence or existence of the qualified signal.

A general object of this invention is the provision of a noise elimination circuit for a pulse receiver which improves the sensitivity of the receiver by discriminating against random (noise) pulses.

Another object is the provision of a noise elimination circuit which permits operation of a receiver at a sensitivity level slightly above average noise level without substantial interference from random noise pulses.

These and other objects of my invention will become apparent from the following description of a preferred embodiment thereof, reference being had to the accompanying drawings in which.

Figure 1:
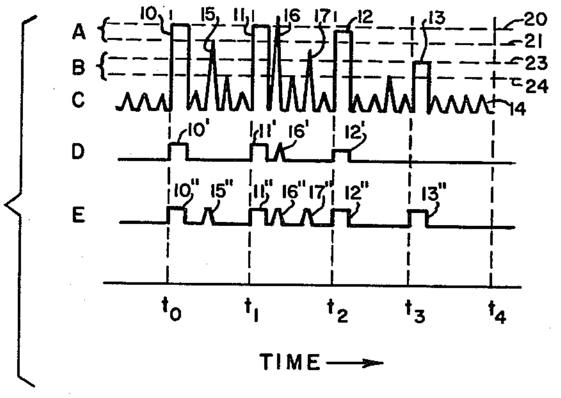
FIGURE 1 is a graphical representation of signal wave forms useful in illustrating the problem to which my invention is addressed.

Referring now to the drawings, and in particular to FIGURE 1–A thereof, there is illustrated a portion of a typical input video signal waveform as provided by a video detector and graphically represented as a function of time. A series of pulse signals 10, 11, 12 and 13 which may have different amplitudes is shown in the presence of noise 14 having a relatively constant amplitude and other random type pulses, such as indicated at 15, 16 and 17 having amplitudes which vary and which exceed the average noise level. For the sake of illustrating the problem to which this invention is addressed, the desired signal pulses 10, 11, 12 and 13 have a constant repetition frequency exemplified by equal spacing between these pulses on the time scale. Pulses 12 and 13 are weaker than pulses 10 and 11, and accordingly have smaller amplitudes as shown.

In accordance with standard practice, clipping circuits are used to discriminate against undesired noise signals. The clipping levels of such a circuit are illustrated by broken lines 20 and 21 in FIGURE 1–A. This circuit slices the upper portion of desired signals, such as signals 10 and 11, which rise about these levels, and produces signals which appear as pulses 10' and 11', respectively, in FIGURE 1–D. While such high level clipping action results in elimination of substantially all the noise, weaker desired signals, such as pulses 12 and 13, are partially or totally eliminated, thereby reducing the effectiveness of the receiver. If the operating levels of the clipping circuit are lowered to the positions shown by broken lines 23 and 24 in FIGURE 1–B, all of the desired signals 10'', 11'', 12'' and 13'' are passed as shown in FIGURE 1–E, but at the same time the number of noise pulses intercepted also increases. Thus, with high level clipping, only random pulse 16'', see FIGURE 1–D, appears in the output of the clipper circuit, but with a reduced clipping level, noise pulses 15'' and 17'' appear in addition to pulse 16'', see FIGURE 1–E.

In gross, the higher the threshold level of the clipping circuits, the more effective is the discrimination against noise and the less sensitive is the circut to desred signals. As the threshold is lowered, the circuit is more sensitive to desired and to random noise pulses which exceed in amplitude the average level of noise 14.

Figure 2:
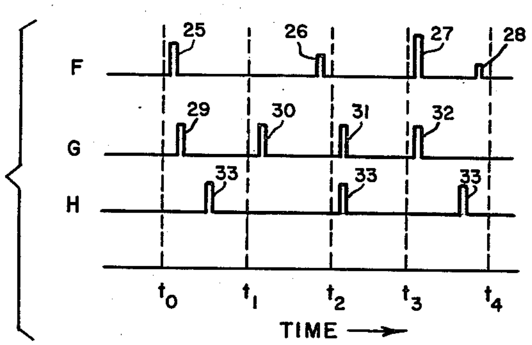
FIGURE 2 is another graphical representation of signal wave forms illustrating random and periodic pulses which are eliminated and accepted, respectively, by the noise gate circuit embodying this invention.

In order to increase the sensitivity of the receiver and to permit the threshold level of the clipping circuit to be reduced to a greater degree before there are false indications of intercepted signals, I have provided a noise gate circuit constituting a high pass pulse repetition frequency filter utilizing a conventional shift register with a variable frequency clock source. Before describing the details of this circuit, it will be helpful first to consider the results achieved by it. Referring to FIGURE 2–F, a succession of random pulses 25, 26, 27 and 28 are shown as they might appear on a time scale which is divided into equal periods by the vertical broken lines $t_0$, $t_1$, $t_2$, $t_3$ and $t_4$. The randomness of these pulses is indicated by variations in their height as well as differences in the time interval between successive pulses. The random occurrence of these pulses may result in a condition wherein no pulse is received during one of the clock periods; for example, in FIGURE 2–F no pulse was received in the clock period defined by times $t_2$ and $t_3$. When this occurs, the condition of the circuit is so altered that it rejects the random pulses. In order that a train of pulses shall be qualified so as to be passed to the circuit output, it is necessary that at least four successive pulses be received in four successive clock periods, respectively, as shown in FIGURE 2–G. Viewed in a different manner, the gate essentially is properly conditioned or pre-set by reception of a pulse signal in each of three successive clock periods so that the fourth signal occurring in the next clock period is qualified and is permitted to pass.

If the frequency of received pulses is less than the clock frequency by a predetermined amount, those signals will not be qualified. If the minimum period between four successive pulses exceeds the clock period by more than one third of a clock period, then no signal will be received during one out of four successive clock periods and the signal is not qualified. This is illustrated in FIGURE 2–H wherein the period between the pulses is approximately 1½ times a clock period. In short, this noise gate circuit passes pulses having a pulse repetition frequency exceeding a certain minimum determined by the clock frequency and rejects pulses having a repetition frequency less than that minimum.

Figure 3:
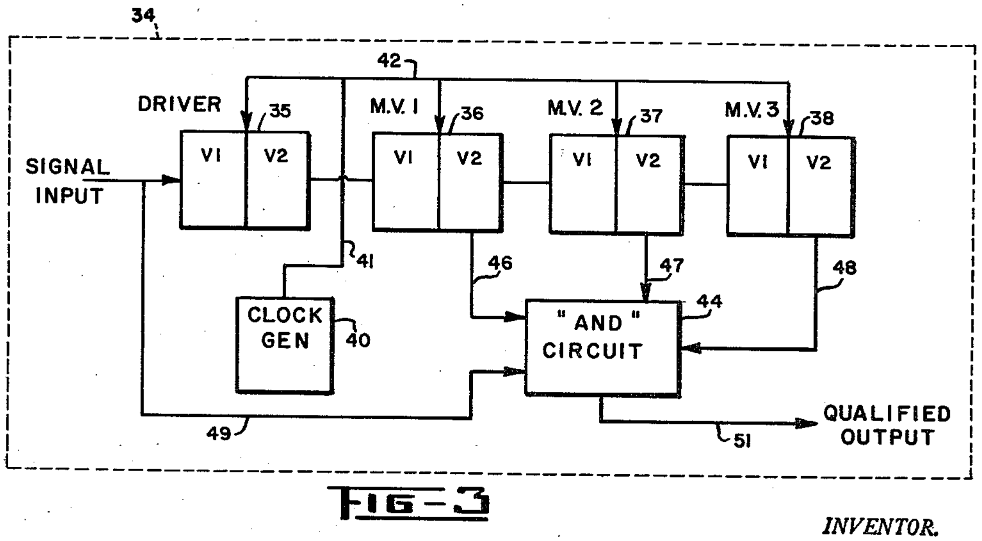
FIGURE 3 is a block diagram of the noise gate circuit embodying this invention.

Referring now to FIGURE 3, there is illustrated within a receiver 34 and in block diagram a shift register circuit comprising a serial chain of bistable multivibrators 35, 36, 37 and 38, a clock generator 40 which produces a succession of timing or shift pulses fed through line 41 and shift bus 42 to each of the multivibrators, and an "AND" circuit 44 which receives the outputs of the latter three multivibrators 36, 37 and 38 through lines 46, 47 and 48, respectively. In addition, the "AND" circuit is connected in parallel across the input to the shift register and receives the input signal by means of line 49. The output signal from the "AND" circuit appears at line 51 and is qualified in the manner explained more fully below.

The bistable nature of each of the multivibrators is illustrated schematically in FIGURE 3 by division of each of the blocks 35, 36, 37 and 38 into two parts designated V1 and V2, respectively. When the left half, as viewed, of one of the multivibrators is so biased that it is not conducting, and the right half is conducting, that unit is said, arbitrarily, to be in the A state. When conditions are such that the circuit flips to the opposite conducting relation with the right side of the multivibrator cut off and the left side conducting, the unit is said to be in the B state. Assume now that multivibrator 35 is in the B state when an input pulse signal is applied to it. This signal causes the unit to switch or flip to the A state in which it will remain until a shift pulse from the clock generator 40 is applied to that stage.

When a shift pulse is applied to stages 35, 36, 37 and 38, the effect is to shift the states of those stages such that each assumes the state of the preceding stage. For example, if such stage 35 is in the A state and stage 36 is in the B state, then upon application of a shift pulse stage 36 shifts to the A state. If stage 36 was in the A state under these conditions, it will remain in the A state. It should be noted that stage 35 is not connected to the "AND" circuit 44 and therefore does not directly affect the logic of the noise gate circuit; the purpose of stage 35 being to convert incoming signals into binary digit form for use in the shift register. The effect of this arrangement of the shift register is that each pulse of an input signal which occurs within a clock period of the clock generator 40 successively "positions" stages 36, 37 and 38 so that their outputs set or condition the "AND" circuit 44. Under these circumstances, circuit 44 is ready to pass the next input signal that occurs within the clock period as a qualified output signal. The circuit, then, requires four successive pulses having a repetition frequency above a certain minimum dictated by the clock generator before the existence of that pulse as a desired signal is recognized.

In order to illustrate the operation of the circuit, assume that each of the multivibrator stages 35, 36, 37 and 38, are in the A state and that random pulses of the type shown in FIGURE 2–F are received at the signal input to the driver stage 35. Assume further that the pulses are received successively from left to right so that the first one to appear is pulse 25. This pulse causes the driver 35 to switch from state A to state B. At time $t_1$ the clock generator 40 produces a shift pulse which sets all of the stages so that stage 36 assumes the state of stage 35, that is, state B, and stage 35 reverts to its former position A. Stages 37 and 38 remain in their original states A. After time $t_1$ but before the next shift pulse at time $t_2$, a second pulse 26 is received. This causes driver stage 35 to switch to state B, the other stages remaining unchanged. Thereafter at time $t_2$ the shift pulse again resets the several stages so that stage 35 is again in position A, stage 36 is in position B, stage 37 now is in position B, and stage 38 remains in position A. So far, the register is at the halfway point in qualifying the received signal.

During the next clock period, however, no pulses are received and accordingly at time $t_3$ when the clock generator produces another shift pulse, the several stages are set as follows: stage 35—position A; stage 36—position A; stage 37—position B; and stage 38—position B. Under these conditions, outputs are applied from stages 37 and 38 through lines 47 and 48, respectively, to the "AND" circuit 44 but no such output appears at line 46 of stage 36. The "AND" circuit is therefore not properly conditioned to pass the next pulse 28 when it is applied to the "AND" circuit, and so this pulse is blocked.

Consider, next, the series of pulses 29, 30, 31 and 32 in FIGURE 2–G. The first two pulses 29 and 30 which occur within the first two clock periods of the clock generator 40 set the stages as described above for pulses 25 and 26 so that at the time $t_2$ after the shift pulse, the stages are in the following positions: stage 35—position A; stage 36—position B; stage 37—position B; stage 38—position A. The following pulse 31 occurs within the next clock period so that upon application of the shift pulse at time $t_3$, all three stages 36, 37 and 38 are in position B with driver stage 35 in position A. The next input pulse signal 32 also occurring within the next clock period, in addition to shifting stage 35 to position B is applied to the "AND" circuit 44 which now has been properly conditioned by signals on lines 46, 47 and 48. Under these conditions, pulse 32 passes through the "AND" circuit and appears as a qualified output signal on line 51. As long as successive pulses fall within successive clock periods, the circuit will continue to pass these pulses as qualified output signals.

As shown in FIGURE 2–H, when the time spacing of several pulses 33, as determined by the pulse repetition frequency, substantially exceeds the time interval of one clock period such that no pulse occurs in the second clock period. As a result, the final pulse 33 appearing in the fourth clock period is not qualified as an output signal.

It is possible, of course, that certain random pulses can be qualified by this circuit and this becomes more likely as the clipping level of the detector circuit is lowered toward the level of the steady noise in the receiver. Nevertheless, the sensitivity of a receiver is substantially increased through elimination of random pulses and the signal to noise ratio is significantly improved. If a still greater degree of discrimination is required, additional stages may be included in the shift register.

Figure 4:
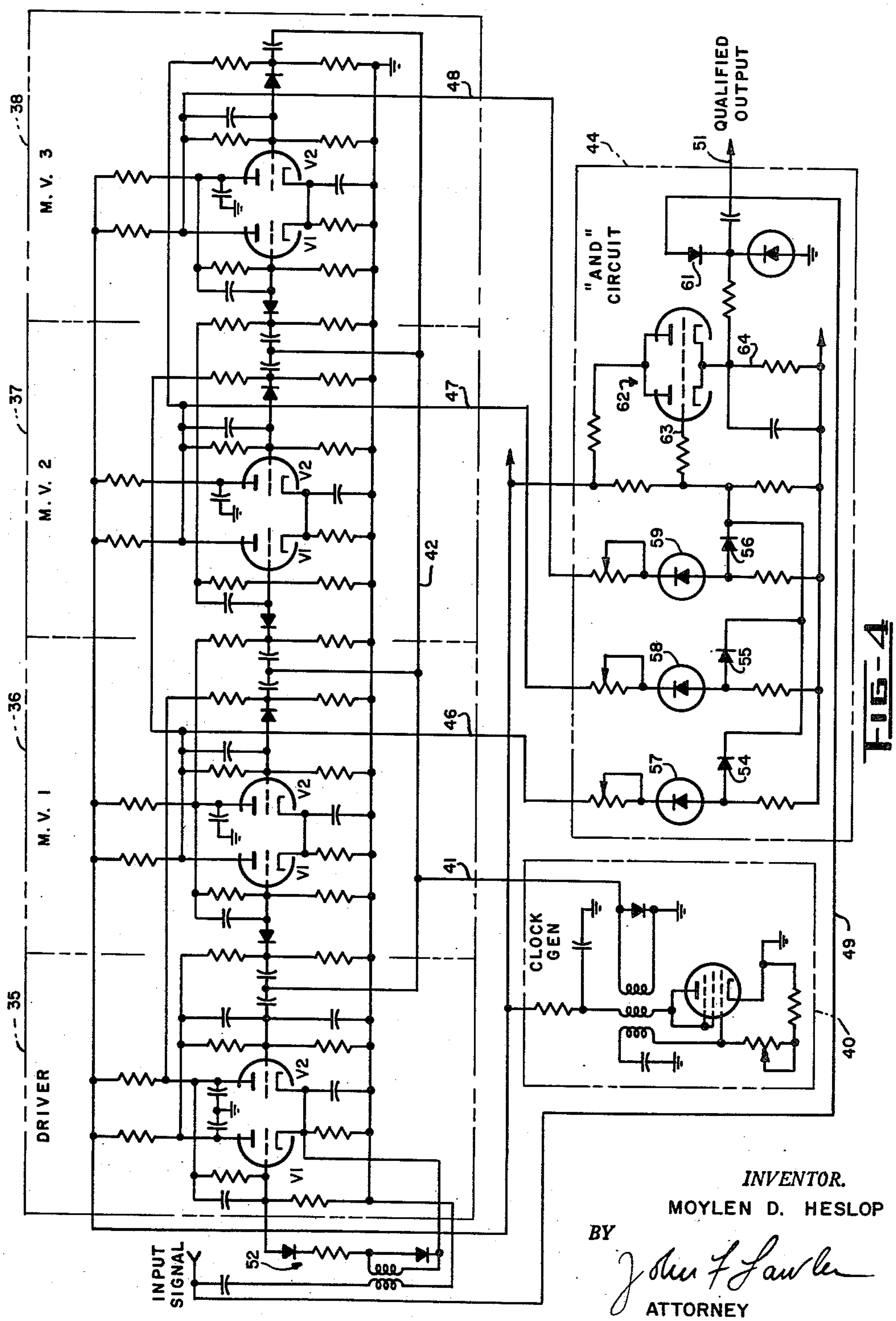
FIGURE 4 is a schematic circuit diagram of the system illustrated in block diagram form in FIGURE 3.

Operation of the noise gate will be better understood by considering the schematic diagram illustrated in FIGURE 4 wherein the broken lines have been used to designate the components comprising the respective blocks in FIGURE 3. Each of the stages 35, 36, 37 and 38 is seen to comprise substantially identical conventional multivibrators each having triodes V1 and V2, which correspond to the parts A and B of the stages in the diagram of FIGURE 3. The input signal is introduced to the serially arranged multivibrators from a suitable detector circuit 52 which produces a negative pulse in response to an input signal, driving the grid of V1 negative and rendering this tube non-conducting. The multivibrator operates through associated circuitry to drive the grid of tube V2 positive so that this portion of the first stage becomes conducting.

It should be noted that in the previous description of the shifting of the various stages from position A to position B corresponds in this instance to the conducting state of V1 and V2; that is, the change of stage 35 from position A to position B corresponds to the change in the conducting state from V1 to V2. The first stage 35 will remain in this state until a negative pulse generated by the clock generator 40 is applied to the grid of V2 by line 41 and shift bus 42.

Upon the occurrence of a shift pulse, which is negative in sense, the grid of V2 is driven negative which causes the first stage to flip back to its original state with V1 conducting and V2 non-conducting. However, prior to the shift pulse, the grid of the tube V1 of stage 36 was positive as a result of the elevation of the plate voltage of tube V1 of stage 35 and therefore the former is in the conducting state. Upon application of the negative shift pulse to the grid of the second stage, V1 of stage 36 becomes non-conducting and V2 becomes conducting. In other words stage 36 assumes the state which the previous stage had after application of the input signal but prior to the occurrence of the shift pulse. This conducting and non-conducting condition of tubes V1 and V2 of stages 37 and 38 is brought about in the same manner as long as an input pulse is received during each successive clock period.

Assume, for example, that input signal did not occur during the next clock period after stage 36 had been shifted so that V1 of that stage was non-conducting and V2 was conducting. It will be recalled that the driver stage had reverted to its initial state with V1 non-conducting and V2 conducting. Upon the occurrence of the next shift pulse, tube V1 of stage 36 which was non-conducting remains non-conducting since its grid is already negative, and V2 of stage 36 remains in its conducting state. Therefore, stage 36 assumes the state of the previous stage 35 which is essentially unchanged. It should be noted when stage 36 (or stages 37 and 38) are in the state in which V1 is non-conducting and V2 is conducting, the output from stage 36 through line 46 (or lines 47 and 48 for stages 37 and 38, respectively) to the "AND" circuit is a relatively high voltage (plate voltage of V1) and as such causes the "AND" circuit to block the passage of the signal as explained below.

"AND" circuit 44 comprises three control diodes 54, 55 and 56 directly coupled to stages 36, 37 and 38, respectively, through continuously conducting diodes 57, 58 and 59 and a fourth or gate diode 61 connected across the output of cathode follower 62. Diodes 54, 55 and 56 are connected in parallel across the control grid 63 of the cathode follower so that each control diode affects the operation of the cathode follower independently of the others. These control diodes are in turn controlled by the operational states of the three multivibrator stages 36, 37 and 38 via lines 46, 47 and 48, respectively. When tube V1 of any stage is in the non-conducting state, the associated control diode (54, 55 or 56) is caused to become conducting. Conversely, the control diode becomes non-conducting when tube V1 of the stage to which it is coupled is conducting. Gate diode 61 is rendered conducting so as to pass a signal to the output if the output voltage of cathode follower is low and becomes non-conducting so as to block the signal if that voltage is high.

Consider the effect when tubes V1 of all three stages are conducting. Diodes 54, 55 and 56 are non-conducting and grid 63 as well as cathode 64 of follower 62 are at a low voltage, so that gate diode 61 is rendered conducting. In this state, diode 61 will pass a signal to output line 51. If any one or all of the control diodes is caused to conduit, the output voltage of cathode follower 62 rises and cuts off the gate diode so that the latter blocks a signal admited to it. In short, all three control diodes must be cut off in order that the gate diode be set to pass signals to the output line 51, and this occurs only when tubes V1 of the three stages 36, 37 and 38 are conducting. On the other hand, if at any time the tube V2 of any of the three stages is caused to conduct, then the signal on line 49 is blocked by the gate diode.

I have described the qualifying circuit 44 herein as an "AND" circuit which name is commonly applied to multiple signal coincidence circuits used in the computer and data processing art.

Changes and modifications to the above described preferred embodiment of my invention may be made by those skilled in the art without departing from the spirit and teachings of the invention. Accordingly, the scope of the invention is defined in the appended claims.

I claim:

1. In a pulse-type receiver, a random noise gate adapted to discriminate between pulse signals and noise signals on the basis of time spacing between successive signals and comprising a multi-stage shift register having a clock pulse generator supplying a pulse during each clock period of predetermined length, means for applying the output of the clock generator to each stage of the register, an "AND" circuit having an output line, means for supplying input pulse signals to said shift register and to said "AND" circuit, and means for connecting said "AND" circuit to said register whereby said "AND" circuit is responsive to said register for passing an input pulse signal to said output line only when the several stages of the register are in a predetermined state, said predetermined state being defined by the occurrence of at least one input pulse signal during each clock period.

2. In a radio frequency receiver adapted to receive and detect time variant noise signals and periodic pulse-type signals, circuit means for discriminating between said noise and pulse signals in response to relatively greater time variation between noise signals than between said pulse signals comprising a shift register having a clock generator adapted to supply a clock pulse during a clock period of predetermined length and having a plurality of series connected stages, a signal input connected to the first in the series of said stages, each of said stages comprising an interconnected pair of bi-stable elements having an output connected to one of said elements, means for connecting the output of said clock generator in parallel with said stages whereby a generated clock pulse is applied simultaneously to all of said stages, each stage being switchable between first and second operating conditions, all of said stages being simultaneously in the second operating condition only upon occurrence of at least one of said signals during each clock period, an "AND" circuit having an output and a plurality of inputs, means for connecting said signal input and the outputs of said stages respectively to said plurality of inputs of said "AND" circuit, said "AND" circuit being responsive to the operating conditions of all of said stages to pass a signal from said signal input connection to said output of the "AND" circuit only when each of said stages is in the second operating condition whereby the output is conditioned upon reception of a succession of pulses equal to one more than the number of said stages and having inter-pulse spacings such that the succession of pulses occur respectively within successive clock periods.

References Cited in the file of this patent

UNITED STATES PATENTS

| | | |
|---|---|---|
| 2,734,684 | Ross | Feb. 14, 1956 |
| 2,868,455 | Bruce et al. | Jan. 13, 1959 |
| 2,896,848 | Miehle | July 28, 1959 |
| 2,950,463 | Brunn | Aug. 23, 1960 |

FOREIGN PATENTS

| | | |
|---|---|---|
| 709,110 | Great Britain | May 19, 1954 |